United States Patent
Bleidistel et al.

(10) Patent No.: US 9,366,857 B2
(45) Date of Patent: *Jun. 14, 2016

(54) CORRECTION OF OPTICAL ELEMENTS BY CORRECTION LIGHT IRRADIATED IN A FLAT MANNER

(71) Applicant: Carl Zeiss SMT GmbH, Oberkochen (DE)

(72) Inventors: Sascha Bleidistel, Aalen (DE); Manfred Maul, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/448,046

(22) Filed: Jul. 31, 2014

(65) Prior Publication Data

US 2015/0062682 A1    Mar. 5, 2015

Related U.S. Application Data

(63) Continuation of application No. 14/079,124, filed on Nov. 13, 2013, now Pat. No. 8,811,568, which is a continuation of application No. 12/565,481, filed on Sep. 23, 2009, now Pat. No. 8,760,744, which is a continuation of application No. PCT/EP2008/053577, filed on Mar. 26, 2008.

(30) Foreign Application Priority Data

Mar. 27, 2007  (DE) .......................... 10 2007 014 699

(51) Int. Cl.
  *G02B 26/08*  (2006.01)
  *G03F 7/20*   (2006.01)
(52) U.S. Cl.
  CPC ........ *G02B 26/0816* (2013.01); *G03F 7/70258* (2013.01); *G03F 7/70308* (2013.01); *G03F 7/70891* (2013.01)

(58) Field of Classification Search
  None
  See application file for complete search history.

(56) References Cited

U.S. PATENT DOCUMENTS 5,390,228 A    2/1995  Niibe et al.
5,610,684 A    3/1997  Shiraishi
(Continued)

FOREIGN PATENT DOCUMENTS

DE    100 00 191    7/2001
DE    101 40 208    3/2003
(Continued)

OTHER PUBLICATIONS

Hazelton et al., "Immersion Lithography in Mass Production: Latest Results for Nikon Immersion Exposure Tools," Nikon Corporation 2007 Immersion Symposium (30 pages).
(Continued)

*Primary Examiner* — Jennifer L. Doak
(74) *Attorney, Agent, or Firm* — Fish & Richardson P.C.

(57) ABSTRACT

The disclosure relates to a correction light device for the irradiation of optical elements of an optical arrangement, in particular a lens, such a microlithography lens having a correction light, which include at least one correction light source and at least one mirror arrangement that deflects the light from the correction light source in the beam path to the optical element such that at least part of at least one surface of at least one optical element of the optical arrangement are irradiated in a locally and/or temporally variable fashion. The correction light strikes the surface of the optical element at a flat angle such that the obtuse angle between the optical axis of the optical arrangement at the location of the optical element and the correction light beam is less than or equal to 105°.

21 Claims, 7 Drawing Sheets

(56) References Cited

U.S. PATENT DOCUMENTS

| | | |
|---|---|---|
| 5,805,273 A | 9/1998 | Unno |
| 5,852,490 A | 12/1998 | Matsuyama |
| 5,995,263 A | 11/1999 | Tokuda et al. |
| 6,091,461 A | 7/2000 | Bardmesser |
| 6,178,028 B1 | 1/2001 | Washiyama et al. |
| 6,198,579 B1 | 3/2001 | Rupp |
| 6,307,688 B1 | 10/2001 | Merz et al. |
| 6,388,823 B1 | 5/2002 | Gaber et al. |
| 6,466,382 B2 | 10/2002 | Muller-Rissmann et al. |
| 6,504,597 B2 | 1/2003 | Schuster et al. |
| 6,521,877 B1 | 2/2003 | Muller-Rissmann et al. |
| 6,522,392 B1 | 2/2003 | Muller-Rissmann et al. |
| 6,583,850 B2 | 6/2003 | Hummel et al. |
| 6,603,530 B1 | 8/2003 | Kohno |
| 6,781,668 B2 | 8/2004 | Schuster et al. |
| 6,912,077 B2 | 6/2005 | Weiss et al. |
| 7,112,772 B2 | 9/2006 | Wagner et al. |
| 7,817,249 B2 | 10/2010 | Uehara |
| 8,111,378 B2 | 2/2012 | Uchikawa |
| 8,760,744 B2 * | 6/2014 | Bleidistel et al. .......... 359/201.2 |
| 8,811,568 B2 * | 8/2014 | Bleidistel et al. ............... 378/34 |
| 2001/0019403 A1 | 9/2001 | Schuster et al. |
| 2001/0019444 A1 | 9/2001 | Takada et al. |
| 2002/0008858 A1 | 1/2002 | Wagner et al. |
| 2003/0235682 A1 | 12/2003 | Sogard |
| 2004/0144915 A1 | 7/2004 | Wagner et al. |
| 2004/0212864 A1 | 10/2004 | Greywall et al. |
| 2005/0018269 A1 | 1/2005 | Weiss et al. |
| 2006/0087635 A1 | 4/2006 | Kazumi et al. |
| 2006/0244940 A1 | 11/2006 | Uehara |
| 2008/0204682 A1 | 8/2008 | Uehara et al. |
| 2010/0290020 A1 | 11/2010 | Mori |
| 2012/0212720 A1 | 8/2012 | Major |
| 2013/0250266 A1 | 9/2013 | Bittner |

FOREIGN PATENT DOCUMENTS

| | | | |
|---|---|---|---|
| EP | 0 532 236 | 3/1993 | |
| EP | 0 678 768 | 10/1995 | |
| EP | 0 823 662 | 2/1998 | |
| EP | 1 376 092 | 1/2004 | |
| EP | 1 376 185 | 1/2004 | ............... G02B 7/18 |
| EP | 1 670 041 | 6/2006 | |
| EP | 1 484 646 | 12/2006 | |
| JP | H088178 | 1/1996 | ............ H01L 21/027 |
| JP | H0845827 | 2/1996 | ............ H01L 21/027 |
| JP | H09232213 | 9/1997 | ............ H01L 21/027 |
| JP | H1050585 | 2/1998 | ............ H01L 21/027 |
| JP | H1064790 | 3/1998 | ............ H01L 21/027 |
| JP | H10256150 | 9/1998 | ............ H01L 21/027 |
| JP | 2001-196305 | 7/2001 | ............ H01L 21/027 |
| WO | WO 03/017004 | 2/2003 | |
| WO | WO 03/040796 | 5/2003 | |
| WO | WO 2006/025408 | 3/2006 | |
| WO | WO 2009/152959 | 12/2009 | |
| WO | WO 2013/044936 | 4/2013 | |

OTHER PUBLICATIONS

Hazelton et al., "Recent performance results of Nikon immersion lithography tools," Optical Microlithography XXI, edited by Harry J. Levinson, Mircea V. Dusa, Proc. of SPIE vol. 6924, 69241N, (2008), 8 pages.

Holly Magoon et al.., "Hyper-NA Lens Challenges," Nikon Precision Inc., Belmont, Calif., Semiconductor International, Reed Business Information, a division of Reed Elsevier Inc. Feb. 1, 2007, 4 pages.

Matsuyama et al., "An Intelligent Imaging System for ArF Scanner", Optical Microlithography XXI, edited by Harry J. Levinson, Mircea V. Dusa, Proc. of SPIE vol. 6924, 69241N, (2008), 9 pages.

Matsuyama et al, "Hyper NA catadioptric projection lens for 1.3NA immersion tool," 3rd International Symposium on Immersion Lithography, Oct. 3, 2006, 26 pages.

Eric R. Mueller, Coherent Inc., and Yusaku Uehara and Kiyoshi Uchikawa, Precision Equipment Co., Nikon Corp , "Putting the Squeeze on Optical Microlithography," from photonics.com Dec. 1, 2008. 6 pages. http://www.photonics.com/Content/ReadArticle.aspx?ArticleID=35972.

Nakashima et al., "Thermal aberration control in projection lens," Optical Microlithography XXI, edited by Harry J. Levinson, Mircea V. Dusa, Proc. of SPIE vol. 6924, 69241N, (2008), 9 pages.

Ohmura et al., "An aberration control of projection optics for multi-patterning Lithography," Optical Microlithography XXIV, edited by Mircea V. Dusa, Proc. of SPIE vol. 7973, 2011 (11 pages).

S. Renwick: "Advanced Imaging Solutions for Shrinking the $k_1$ Gap," Nikon Precision Inc., TechXPOT 2009 (16 pages).

Uehara et al., "Thermal aberration control for low k1 lithography," Proc. of SPIE vol. 6520 65202V-1, (2007), 11 pages.

Webster's New World Dictionary, Third College Edition, "wavelength", p. 1511, 1991.

German Office Action, with an English translation, for the corresponding German Application No. 10 2007 014 699.1, dated Aug. 20, 2007.

* cited by examiner

CORRECTION OF OPTICAL ELEMENTS BY CORRECTION LIGHT IRRADIATED IN A FLAT MANNER

CROSS-REFERENCE TO RELATED APPLICATIONS

This application is a continuation of, and claims benefit under 35 USC 120 to, U.S. application Ser. No. 14/079,124, filed Nov. 13, 2013, which is a continuation of, and claims priority under 35 USC 120 to, U.S. application Ser. No. 12/565,481, filed Sep. 23, 2009, now U.S. Pat. No. 8,760,744, which is a continuation of, and claims priority under 35 USC 120 to, international application PCT/EP2008/053577, filed Mar. 26, 2008, which claims benefit of German Application No. 10 2007 014 699.1, filed Mar. 27, 2007. International application PCT/EP2008/053577 and U.S. application Ser. No. 12/565,481 are is hereby incorporated by reference in its their entirety.

FIELD

The disclosure relates to a method and a device for irradiation of optical elements of an optical arrangement, for example a lens, such as a microlithography lens, with correction light for changing the optical properties of the lens and a corresponding lens in which this is used.

BACKGROUND

In optical configurations, such as lenses for microlithography, especially projection exposure installations for microlithography, non-rotationally symmetrical illumination or a slit-shaped image field can lead to inhomogeneous irradiation of optical elements, which in turn can lead to inhomogeneous heating of the corresponding optical element. The inhomogeneous heating can lead to corresponding distortions or stresses, which in turn can lead to changes in the optical properties of the optical element and to imaging errors.

SUMMARY

In some embodiments, the disclosure provides a device for irradiation of optical elements of an optical arrangement with correction light (correction light device), which avoids certain undesirable disadvantages while facilitating lateral irradiation with correction light onto the optical element to be corrected, even at small distances from the next optical element or part. At the same time, the corresponding device can have a simple design and can be simple to use.

In certain embodiments, a device and an associated working method are provided in which the irradiation of an optical element of an optical arrangement with correction light proceeds via at least one mirror arrangement, which deflects the correction light from a correction light source towards the optical element, such that at least parts of at least one surface of at least one optical element of the optical arrangement can be irradiated at a flat angle relative to the surface of the optical element in a locally and/or temporally variable fashion. The obtuse angle between the optical axis of the optical arrangement at the place of the optical element and the correction light ray is less than or equal to 105° (e.g., less than or equal to 100°, less than or equal to 95°), and the acute angle between the surface of the optical element and the correction light beam is less than or equal to 15° (e.g., less than or equal to 10°, less than or equal to 5°).

Such a flat irradiation angle can enable a corresponding correction of thermal inhomogeneities of the optical element even at short distances from the next part. In particular, a lateral, optionally spaced arrangement of the correction light device from the optical axis of the optical arrangement is possible, such that no impairment of the optical arrangement need be feared or such that easy interchangeability of the correction light device is possible.

The term correction light in this regard includes any electromagnetic radiation, but especially infrared light with a wavelength greater than or equal to 4 µm.

Flat irradiation with correction light onto the optical element to be corrected can be realized in two ways. First, realization via a scanning device is possible and, second, it is proposed that a two-dimensional image of a multi-mirror array (MMA) be used. From one aspect of the disclosure, protection is also sought independently for the use of a multi-mirror array in a corresponding correction light device.

Beam divergence or convergence of the correction light beam can be minimised by choosing a correction light beam of low divergence or numerical aperture, wherein the divergence of the laser beam used can be calculated from the formula for the half-width value $(1/e^3)$ w (z, w0) at a distance z from the beam waist $$w(z, w0) := 1,5 \sqrt{(w0)^2 \left(1 + \left(\frac{\lambda \cdot z}{\pi \cdot w0^2}\right)^2\right)}$$

or by the formula (diffraction-limited point image)

$$d = \frac{K \cdot \lambda}{2 \cdot NA}$$

where w0 denotes the beam waist, z is the distance from the beam waist, is the wavelength, d is the waist diameter and K is a factor, which takes account of the radial intensity of the laser beam perpendicular to the propagation direction for a Gaussian distribution of the radial intensity. NA denotes the numerical aperture. In general, neither of the two borderline cases will apply purely. This means, however, that a laser beam which is optimal in respect of divergence can be determined for a particular application case.

Regardless of the technical realization of the correction light device, some fundamental physical aspects arise from flat irradiation with the correction light:

a) The dependence of the size of the light spot generated on the optical element to be corrected on the angle of incidence (projection of the light bundle diameter onto the surface), and the change in this size and in the degree of absorption at the element to be corrected when the angle of incidence is varied.

b) The numerical aperture (NA) needed for the production of a light spot c) The depth of field associated with the numerical aperture (NA) and the associated enlargement of the light spot when the area of focus is exited.

These relationships are discussed below in more detail.

A multi-mirror array (MMA) can consist of a plurality of mirror elements which are arranged side-by-side and which can be swivelled separately from each other. The mirror elements can be arranged in rows and columns in a field, with individual mirror elements capable of swivelling between one position in which correction light is directed onto the optical element (correction light position) and a second position in which no correction light is directed onto the optical element. This defines two digital states, in which correction light is either directed or not directed onto the optical element to be corrected via the corresponding mirror element. Thus, since each mirror element of the multi-mirror array is assigned to a particular region of the surface of the optical element to be corrected, it is possible to effect a locally variable setting of the correction irradiation by controlling the position of the individual mirror elements. At the same time, it is possible to exert corresponding temporal control, too, by controlling the timing of the correction light position of each mirror element.

Rapid switching of the mirror elements through switching and cycle times in the region of <1 second, particularly <<1 second, can serve the purpose of controlling the intensity, i.e. of determining the quantity of light applied to a specific area of the optical element, while slow change switching or cycle times of >1 second can be used for the purpose of adaptation of the spatial distribution of the correction light. The rapid switching of the mirror elements can thus essentially be used, for example, to determine the heating of the corresponding surface region by the rapid succession of switching the correction light on and off, while a superimposed slower switching of specific regions of the multi-mirror array contributes to corresponding differential heating of different regions of the optical element.

The mirror elements, in order that full-face illumination or irradiation of the surface of the optical element to be irradiated may be maximized, should be provided as closely as possible to each other, i.e. at a minimum possible distance from each other. However, a consequence of this can be that the individual mirror elements influence each other in such a way that, in the case of neighbouring mirror elements of which one is in the correction light position, i.e. directs the correction light onto the optical element to be irradiated, and of which the other is in the non-correction light position, shadowing occurs. This can be countered by choosing the swivelling position of the individual mirror elements such that the small adjustment angle does not create mutual shadowing. Alternatively or in addition, a control can be provided that takes account of the fact that neighbouring mirror elements may possibly only be allowed to partially swivel in order that corresponding shadowing effects may be avoided.

If the dimensions of the multi-mirror array (MMA) are chosen accordingly, the correction light which is irradiated onto the multi-mirror array can be irradiated directly onto the surface of the optical element to be irradiated.

Alternatively, it is also possible to provide a correction light arrangement with which the image of the mirror arrangement can be imaged onto the optical element of the optical arrangement. This allows, for example, different proportions of multi-mirror array on one hand and the surface of the element to be irradiated on the other to be adjusted to each other.

The correction light arrangement can include a diaphragm and two optical lenses, especially convex lenses, optionally as a double telecentric arrangement, which facilitates imaging of the field of the multi-mirror array onto the surface to be irradiated. Several optical lenses or lens groups are conceivable, too. Particularly, the corresponding choice of focal lengths can allow the multi-mirror array to be provided at a marked distance away from the optical axis of the optical arrangement of the optical element to be irradiated, such that no undesirable influencing of the imaging properties of optical arrangement of the multi-mirror array need be feared.

For the irradiation of two, optionally opposing surfaces of neighbouring optical elements of the optical arrangement, two mirror arrangements can be provided in the form of multi-mirror arrays with their backs to each other. Obviously, it is also possible to combine several correction light devices with several correction light sources for the purpose of correcting various optical elements.

To prevent neighbouring mirror elements of the mirror arrangement of a multi-mirror array from causing mutual shadowing effects, a diffraction grating can be provided between the multi-mirror array and the optical element to be irradiated or a correction light arrangement for the purpose of imaging the field of the multi-mirror array onto the optical element. The diffraction grating ensures that, at large angles, especially perpendicular from the multi-mirror array, reflected correction light, which is therefore not subject to shadowing effects, is diffracted such that it is at a flat angle when it strikes the optical element to be irradiated. Accordingly, light of the first or a higher diffraction order is used as correction light.

In some embodiments, the diffraction grating can be provided both in the beam path between the correction light source and the multi-mirror array and between the multi-mirror array and the optical element to be irradiated or a correction light arrangement for the purpose of imaging the field of the multi-mirror array onto the optical element. This is particularly advantageous if the grating used allows light of one polarization direction to pass largely unimpeded and diffracts light of the orthogonal polarization direction largely completely at a large angle. Such a grating with a period in the magnitude of the wavelength is feasible with high efficiency in the preferred wavelength range.

For example, if light which is linearly polarized in one direction and a large percentage of which is transmitted through the polarizing grating in the zeroth diffraction order, the result is a high yield for the irradiation of the multi-mirror array. If the grating is followed by a quarter-wave plate ($\lambda/4$ plate) whose optical axis is rotated by 45° against the direction of light polarization, the quarter-wave plate generates circularly polarized light, which strikes the multi-mirror array.

After reflection of the correction light by the mirrors of the multi-mirror array, the circularly polarized light, on passing once again through the quarter-wave plate, is polarized to a linearly polarized light with polarization direction rotated at 90° to the first polarization direction, with the light which was diffracted by the diffraction grating into the first or higher diffraction order serving as correction light. The yield of the light diffracted into the first or higher diffraction order can be optimized by the changed polarization direction.

The correction light source can be an anamorphic light beam and in particular a laser beam, whereby the numerical aperture of the correction light beam in a plane parallel to the irradiation direction onto the multi-mirror array and perpendicular to the multi-mirror array is kept small, while a greater numerical aperture is permissible in a direction perpendicular thereto. This stems from the flat irradiation angle onto the multi-mirror array or the optical element, as a result of which the beam cross-section in one direction is greatly expanded, whereas no distortion occurs in the vertical direction thereto. Similarly, a larger numerical aperture can also be allowed in the direction in which no distortion occurs.

The functioning of the correction light device using a multi-mirror array (MMA) with a plurality of individually controllable or swivellable mirror elements is as follows:

The correction light source irradiates the full surface of the field of the multiple mirror array having the plurality of mirror elements, with the mirror elements capable of being in the correction light position in which the incident correction light is deflected by deflection onto the surface of the optical element to be irradiated. Now, if locally differentiated irradiation or corrections are made, individual, several or, in an extreme case, all mirror elements can be transferred from the correction light position into the second, non-correction light position in which the correction light no longer strikes the surface of the optical element to be irradiated. This can also be used not only to effect local differentiation, but also to control the energy or power consumption of the optical element and thus heating. Similarly, given adequate irradiation of a specific region of the surface of the optical element, the mirror elements can be transferred into the non-correction light position, while, in the event of heating, the mirror elements can be correspondingly transferred into the correction light position.

To ensure high uniformity of illumination by the correction light, a homogenizing element can be provided. In particular, candidates for these are crystal rods, known as light boxes or hollow rod integrators (Hohlstabsintegratoren), which effect homogenization, through multiple reflection, of the light striking the MMA.

In accordance with a further possible solution for realizing a correction light device, the mirror array can be formed as a first scanning device, with the mirror array including one or more mirror surfaces which are rotated or swivelled in an oscillating manner or displaced such that the correction light beam moves over the optical element line by line along a scanning direction.

Where several mirror surfaces are provided, they can be arranged adjacent to each other in polygon fashion, such that, as a result of a rotation of the mirror array about an axis parallel to the mirror surfaces, the individual mirror surfaces can successively interact with the correction light beam.

Besides this first scanning device, in which at least one mirror surface, optionally several mirror surfaces, are rotated, swivelled or displaced, to effect in a first scanning device irradiation of different regions of the surface to be irradiated, a second scanning device can additionally be provided, which facilitates a movement of the correction light beam in a second scanning direction, optionally perpendicularly to the movement of the first scanning direction.

Through corresponding superimposition of the movements of the first and second scanning device, line-by-line rasterizing of the surface of the optical element can occur, such that all areas of the surface of the optical element to be irradiated are covered by the correction light beam in a temporal sequence.

As two different scanning devices are provided for the different scanning or rasterizing of the surface of the optical element in different directions, an anamorphic correction light beam which differs in the principal directions may be used. In particular, the numerical aperture in the plane of the first, especially the faster scanning direction can be smaller than in the plane perpendicular thereto, since the size of focused light spot transverse to the faster scanning direction is greatly increased by the flat angle of incidence. Accordingly, the diffraction spot in the faster scanning direction can be chosen to be larger.

Through the corresponding shape of the correction light beam, a polygon arrangement with several mirrors arranged side by side at an angle to each other, for example, can be used as a scanning device, such that the mirror elements have a rectangular shape with very short sides on one hand and very long sides on the other. The outcome is a polygon mirror which is cylinder-like and whose main surface has a plurality of narrow, but high mirrors, such that the cylinder radius can be chosen to be small. This in turn allows high rotation speeds and thus scanning speeds since the centrifugal forces are smaller and thus more easily manageable due to the small radius.

Through corresponding control of the correction light such that the properties of the correction light are changed as a function of time, for example, the light intensity or the light power, the desired temporal and/or locally variable irradiation of the surface can be performed at the corresponding points of incidence of the correction light beam on the surface of the optical element.

Due to non-parallel shaping of the correction light beam bundle, different angles of incidence on the surface of the optical element to be irradiated can lead to changes in the incident beam cross-section, such that defined correction of inhomogeneous heating of the optical element by the correction light bean is impeded.

Accordingly, the correction light device can be configured, such that compensation of the impact cross-section is provided, i.e. care is taken to ensure that the beam cross-section of the correction light beam incident on the surface of the optical element to be irradiated is approximately constant over the entire scanned region.

Due to the numerical aperture of the correction light beam, enlargement of the incident light spot may occur during defocusing, too. In a tilted object, different distances in the correction light device can bring about defocusing.

Constant maintenance of the cross-sectional size of the correction light beam incident on the surface of the optical element to be irradiated can be achieved by providing focus tracking, which either is provided separately in the light beam of the correction light or can be integrated into the second scanning device. Separate focus tracking can be realized by providing a lens group, for example, including two convex lenses, of which one can be displaced by translation along the optical axis of the correction light beam.

Alternatively, the focus tracking can be integrated into the second scanning device, if this has a mirror capable of translation, such that focus tracking is formed correspondingly by this module, or is dispensable due to the design of this module.

The separate focus tracking can be provided in the correction light beam in front of the mirror array, i.e. the first scanning device. Also advantageous is an arrangement of the focus tracking in the region of an intermediate focus in the correction light beam path.

For the purpose of defined irradiation of the surface of the optical element, an optical correction light arrangement including at least one or more optical elements such as lenses, lens groups, mirrors, diffractive or refractive optical elements can be provided in the beam path of the correction light, with in particular a corresponding optical correction light arrangement capable of being provided between the mirror array, i.e. the first scanning device and the second scanning device.

Optionally, by the use of the optical correction light arrangement, the correction light beam is focused with a large focal length or cross-sectional width (focal intercept) onto the surface of the optical element of the optical arrangement in order that the correction light device may be provided at a distance from the optical axis of the optical arrangement of the optical element to be irradiated. In this way, a negative influence exerted by the correction light device on the optical arrangement may be reduced or largely ruled out. By way of focal length or cross-sectional width (focal intercept), the values chosen can be in the range $\geq 200$ mm (e.g., $\geq 400$ mm, greater than or equal to 600 mm).

For the purpose of being able to correct thermal inhomogeneities of the optical element by correction light, especially infrared light, in the case of the correction light device with scanning device, the irradiation is varied in accordance with the point of incidence of the correction light on the surface to be irradiated. To this end, a regulator, especially an output regulator, can be provided for the correction light, the output regulator interacting with the mirror array, i.e. the first scanning device and/or the second scanning device, such that the correction light is variably adjusted as a function of the location of the correction light beam on the surface of the optical element.

To this end, an acoustic-optic modulator (AOM) can be provided, which functions as a switch or regulator for the correction light.

In connection with a sensor device, which determines the irradiation of the optical element and/or the temperature inhomogeneities, automatic control of the acoustic-optic modulator can be provided.

Overall, an automatic open-loop control and/or closed-loop control device can be provide, which provides open-loop and/or closed-loop control over the working parameters of the correction light device by a sensor device.

BRIEF DESCRIPTION OF THE FIGURES

Further advantages, characteristics and features of the disclosure are apparent from the following detailed description and the drawings, in which.

DETAILED DESCRIPTION

Figure 1:
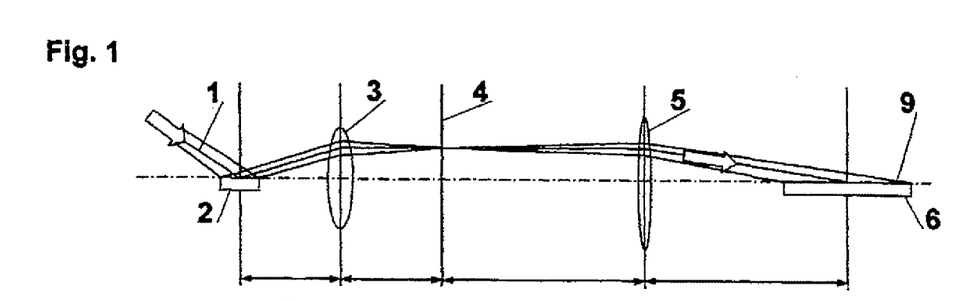
FIG. 1 is a schematic arrangement of a correction light device with a multi-mirror array (MMA)

FIG. 1 shows a schematic side view of a first exemplary embodiment of a correction light device, in which, from a correction light source not shown, a correction light beam 1 in the form of infrared light strikes a multi-mirror array 2 (MMA) at an angle such that the correction light beam 1 is deflected at the mirror elements of the multi-mirror array 2. Provided that mirror elements are arranged in a first position relative to the incident correction light beam 1, they are imaged via the downstream correction light arrangement consisting of two lenses 3 and 5 and the diaphragm 4 onto the surface 9 of the optical element 6, such that the striking of the infrared radiation on the optical element 6 gives rise to corresponding heating. The optical element 6 can be provided in an optical arrangement of a microlithography lens (not shown).

If individual mirror elements of the multi-mirror array 2 are not in the first position, in which the incident correction light 1 is imaged onto the surface 9 of the optical element 6, but rather in a second position such that the incident correction light 1 is deflected such that it is not imaged onto the surface 9 of the optical element 6 by the optical correction light arrangement, then, the corresponding regions of the surface 9 of the optical element 6, which are assigned to those mirror elements of the multi-mirror array 2 which are in the second position, do not undergo heating by the correction light 1. That correction light 1 which is blocked out from the correction light beam by the mirror elements of the multi-mirror array in the second position can, for example, be intercepted by diaphragm 4 or other diaphragm arrangements.

In such a correction light device, it is possible, through controlling the mirror elements of the multi-mirror array, to change the location and timing of irradiation of the optical element 6 with correction light, and thereby, for example, through the use of infrared light, to effect correction heating of the optical element 6 for a certain period of time in those areas in which the optical element 6 is unevenly heated by, for example, non-uniform irradiation with imaging light of the optical arrangement of optical element 6. Similarly, a sensor device (not shown) can be provided, by whose measurements the multi-mirror array can be automatically regulated such that detected inhomogeneities relating to heating of the optical element 6 are automatically compensated.

Figure 2:
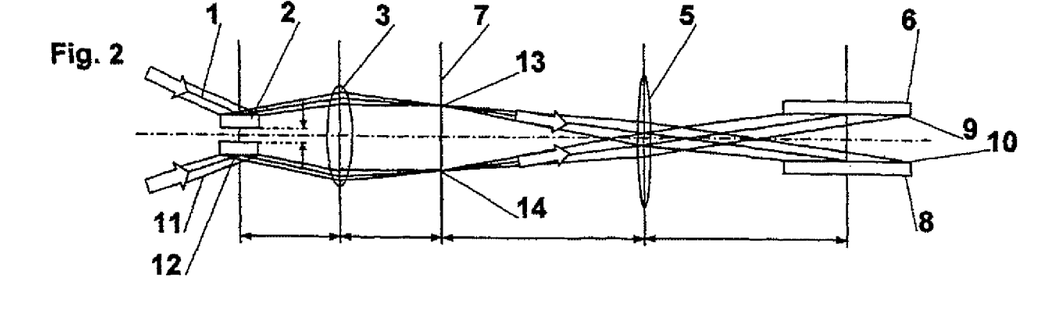
FIG. 2 shows a correction light device.

Whereas FIG. 1 shows a correction light device for irradiation of the surface 9 of the optical element 6, FIG. 2 shows a correction light device in which two multi-mirror arrays 2 and 12 are arranged back to back such that two correction light beams 1 and 11 from two correction light sources, not shown, are directed via a corresponding optical correction light arrangement onto two surfaces 9 and 10 from two different optical elements 6 and 8 of an optical arrangement, such as a microlithography lens.

Since the same components are partially used in FIG. 2 as in the device of FIG. 1, these are provided with the same reference symbols, such that an additional description of these components is unnecessary. What follows therefore concerns only the differences from the exemplary embodiment of FIG. 1.

As can be seen in FIG. 2, instead of a diaphragm 4 with one transmission opening as in the exemplary embodiment of FIG. 1, a diaphragm 7 with two transmission openings 13 and 14 is used to transmit the two correction light beams 1 and 11, which strike the mirror elements in the first position, i.e., the irradiation position.

To keep the dimensions of the optical elements, such as lenses 3 and 5, and the diaphragm 7 of the optical correction light arrangement small, it is possible for the multi-mirror array to be arranged with the minimum possible distance between their backs. This distance can only 10 mm or less, such as 5 mm or less.

However, it is also possible and conceivable for the multi-mirror arrays to be arranged separately from each other in conjugated planes and thereby for the space constrictions to be minimized.

Via the correction light devices of FIGS. 1 and 2, the multi-mirror arrays are used to effect simultaneous, full-face irradiation of the surfaces 9 and 10 of the optical elements 6 and 8, whereby, through corresponding tilting of individual mirror elements, individual or all regions of the irradiation surface can be provided with correction light or not. With that, local variation of the irradiation is feasible. In addition, the duration of irradiation can also be set by switching the mirror elements correspondingly. With that, temporal variability is feasible. Moreover, the correction light sources used can be varied according to their on-duration, power, etc.

As FIGS. 1 and 2 further show, the exemplary embodiments shown are capable of laterally irradiating optical elements 6 and 8 in an optical arrangement at a very shallow irradiation angle.

Figure 3:
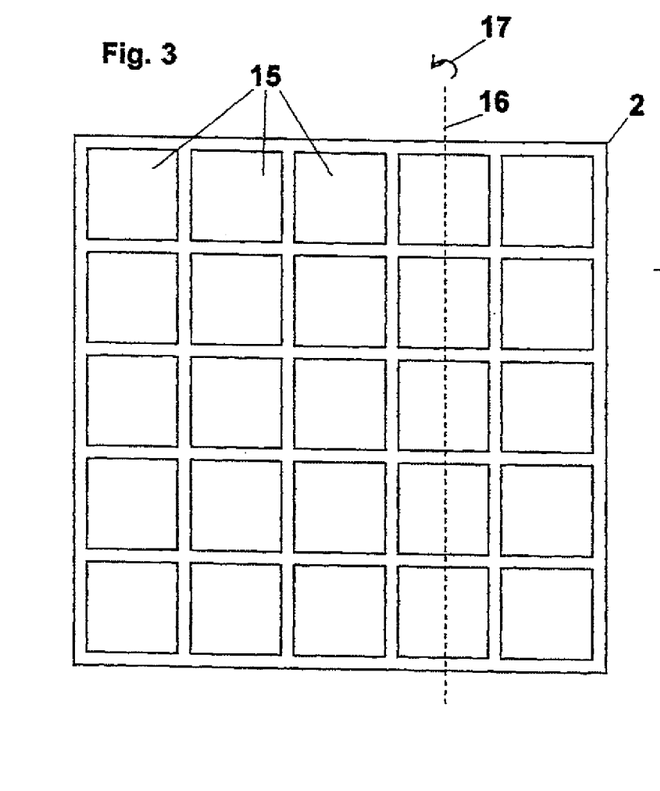
FIG. 3 is a plan view of a multi-mirror array, as used in the devices of FIGS. 1 and 2.
Figure 4:
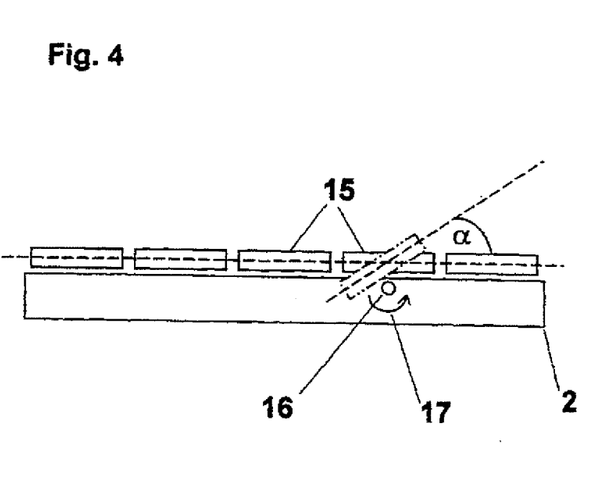
FIG. 4 is a side view of the multi-mirror array from FIG. 3.
Figure 5:
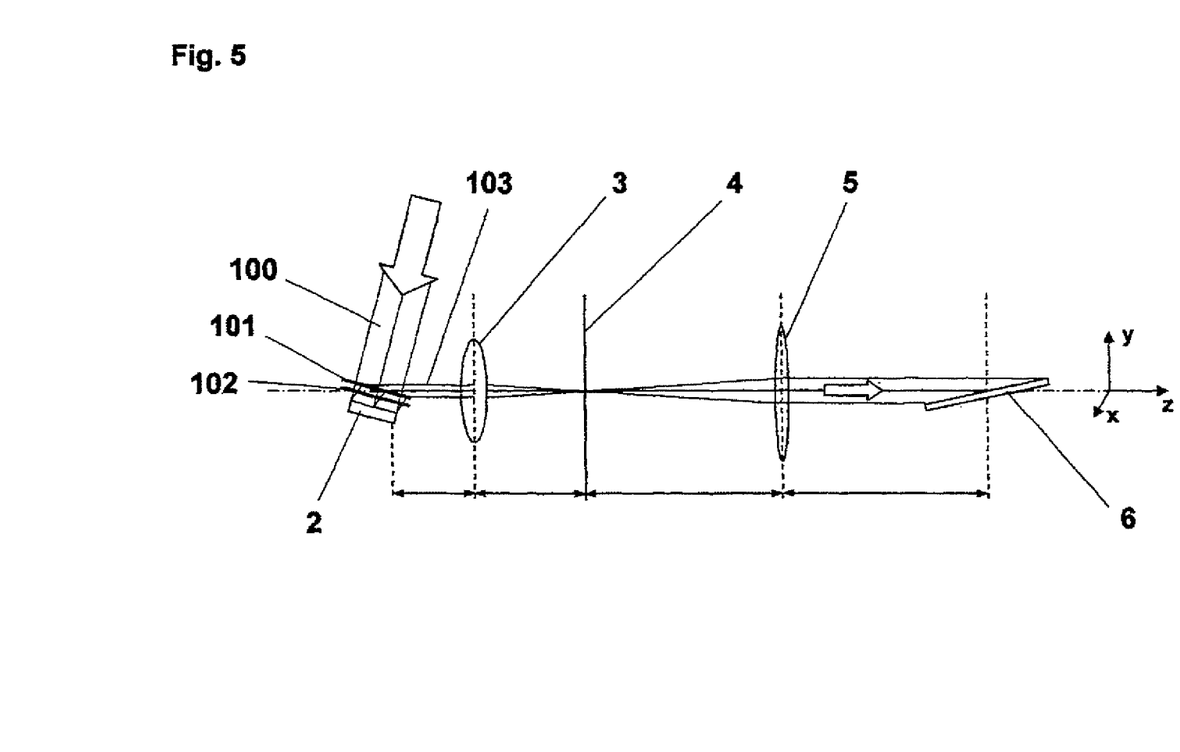
FIG. 5 shows a correction light device.

FIGS. 3 and 4 show the multi-mirror array 2 in a plan view and a side view. The multi-mirror array including five rows and five columns has a total of 25 mirror elements 15 which, in the case of the fourth row, for example, can be swivelled about an axis of rotation 16 in line with the arrow 17, such that they can be swivelled between a first position which, for example, is aligned horizontally, and a second position in which the mirror surface of the mirror elements 15 is oriented at an angle $\alpha$ to the horizontal. The horizontal first position can be the irradiation or correction light position in which incident correction light, for example infrared light, strikes the surface of the optical element to be irradiated, while the second position inclined towards the horizontal is the position in which the incident correction light is not directed onto the surface of the optical element 6 and 8 to be irradiated.

The angle $\alpha$ should be as small as possible in order that shadowing effects of neighbouring mirror elements 15 may be avoided. At the same time, the distance between the individual mirror elements 15 should also be kept as small as possible in order that maximum-possible full-face irradiation of the optical elements 6 and 8 may be guaranteed.

Figures 6, 7:
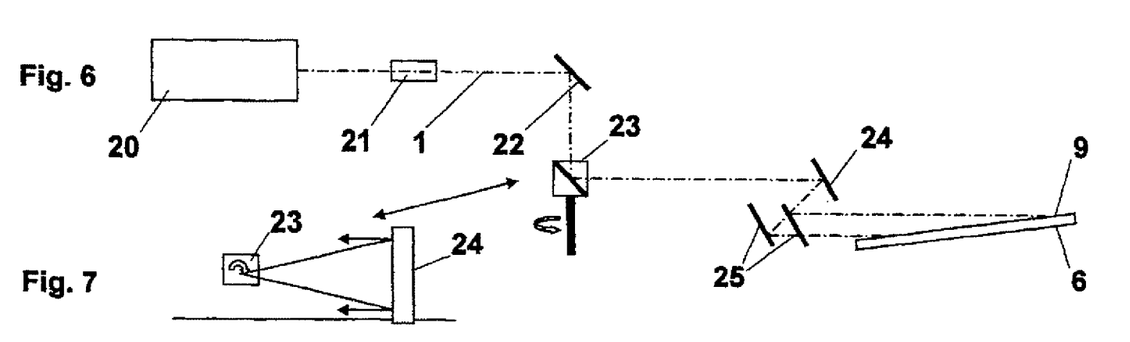
FIG. 6 shows a correction light device.
FIG. 7 is a detailed view of a part of the correction light device from FIG. 6.

FIG. 6 shows in an illustration similar to FIGS. 1 and 2 a third exemplary embodiment of a correction light device, which largely corresponds to those from FIG. 1. Accordingly, the same components have identical reference symbols, and a repeated description of these components is unnecessary. In the following, consequently only the additional components present and the differences between the exemplary embodiments of FIG. 6 and FIG. 1 are discussed.

In the correction light device, a polarizing diffraction grating 101 and a $\lambda/4$ plate 102 are provided in the beam path between the multi-mirror array 2 (MMA) and the correction light source (not shown). At the same time, the polarizing diffraction grating 101 and the quarter-wave plate 102 are also in the beam path from the multi-mirror array 2 to the optical element 6, with the correction light additionally passing through the optical correction arrangement consisting of the lenses 3 and 5, and the diaphragm 4.

In the exemplary embodiment shown in FIG. 6, linearly polarized light of polarization direction s is used, for which the diffraction grating 101 in the zeroth diffraction order has a very large transmission efficiency.

Via the quarter-wave plate ($\lambda/4$-plate) 102 provided after the diffraction grating 101, the linearly polarized light is converted into circularly polarized light. After the circularly polarized correction light strikes the mirror elements of the multi-mirror array 2 and is reflected, the circularly polarized light is converted by quarter-wave plate 102 back into linearly polarized light with a second polarization direction p perpendicular to s, with this polarization direction p facilitating a high light yield in the first diffraction order of the diffraction grating 101. The first diffraction order of the diffraction grating 101 is located for example at an angle of 70° to the angle of incidence, such that now, instead of correction light which originally was almost perpendicular to the multi-mirror array, a correction light which is radiating flat relative to the multi-mirror array and the optical axis is fed into the optical correction arrangement 3, 4, 5 where it too is irradiated at a flat angle onto the optical element 6.

Through the use of the diffraction grating, the correction light can thus be projected onto the multi-mirror array at relatively large angles and be reflected from this, such that shadowing effects due to neighbouring mirror elements need not be feared. Through subsequent use of the light of the first or higher diffraction order of the diffraction grating, the correction light is projected correspondingly flat onto the optical element, however. The use of polarized light in conjunction with the quarter-wave plate 102 makes for optimal usage of the correction light. Were a non-polarizing diffraction grating only to be used, the efficiency would be significantly lower due to the low intensity of the diffracted beam. The use of a diffraction grating only would be conceivable, admittedly.

The use of the polarized light, however, not only leads to a higher light yield and hence higher efficiency of the correction light device, but also, due to the better absorption of p polarized radiation by the optical element to be irradiated, the overall output of the light source can be reduced.

FIGS. 6 to 9 show other exemplary embodiments of a correction light device in which, however, instead of two-dimensional imaging of a correction light pattern by a multi-mirror array, a scanning or rastering device is provided by which the correction light beam can be guided over the surface of the optical element to be irradiated, with variation of the correction light as a function of the location of the correction light beam on the surface to be irradiated enabling the correction light to also be varied in location and time. In this way, here too, correction, for example, of differential heating of the optical element due to inhomogeneous irradiation with imaging light of the optical arrangement can be compensated. Such a correction device, too, can project light at a very flat angle laterally into an optical arrangement and onto the surface of an optical element, although, due to the flat angle of incidence and the movement of the light beam over the surface, allowance is desirably made for a change in the projected size of the correction light beam on the surface of the optical element due to the numerical aperture of the correction light beam.

FIG. 6 shows a first exemplary embodiment of a corresponding correction light device in which a $CO_2$ laser functions as a correction light source 20. The correction light 1 of the $CO_2$ laser 20 is guided through an acoustic-optic modulator (AOM) 21 which serves as the switching and/or control element for the correction light 1. Through corresponding control of the AOM 21, the correction light properties, such as intensity, light output and the like can be varied, such that ultimately irradiation of the optical element 6 at the respective point of incidence of the correction light beam 1 can be set.

In the exemplary embodiment shown in FIG. 6, the correction light beam 1 is deflected by a mirror element 22, and directed onto a first scanning device 23 in the form of a mirror, which rotates about an axis such that the correction light beam 1 is deflected at different angles, such that the correction light beam 1 is moved along a line across the optical element 6.

The correction light beam 1 is deflected via a further mirror 24 to a displaceable mirror 25, and finally lands on the surface 9 of the optical element 6. Via the displaceable mirror 25, the correction light beam 1, in accordance with the position of the mirror 25, will strike different locations on the surface 9 of the optical element 6. Due to the translational movement of the mirror 25, the correcting beam 1 can thus be moved along a second line, which is aligned perpendicularly to the first line of the first scanning device 23, such that the displaceable mirror 25 constitutes a second scanning device. The mirror 24 can be a focusing concave mirror which serves to produce a light spot on the surface 9. The mirror can generally be a diffractive or refractive element with collecting action that focuses the light onto the object. The focussing element is arranged at a focal length distance from the scanning device 23, such that all light bundles are parallel in object space and thus no changes of angle occur at the object (see FIG. 7).

In this regard, the correction light beam 1 is moved faster along the first scanning direction or line by the first scanning device 23 than by the second scanning device 25 perpendicular thereto. In this way, the surface 9 of the optical element 6 can be rasterized (scanned) line by line in order that each point on the surface 9 of the optical element 6 can be covered. Optionally, the translational movement of the mirror 25 can proceed incrementally, such that every time the first scanning direction has been performed, the second scanning device 25 is shifted by one increment in order that the second line on the surface 9 of the optical element 6 may be performed, etc. However, an oscillating movement of the displaceable mirror element 25 in the form of a sinusoidal or cosinusoidal vibration can occur, too, for example, at a frequency of 50 Hz. The speed of a simple mirror array of the kind shown in FIG. 6 can, for example, amount to 360,000 revolutions per minute for a frequency of 6 kHz.

Instead of a simple mirror arrangement, a polygon mirror arrangement can also be used in which several mirror surfaces are arranged together in the form of a polygon, such that, when the polygon mirror array is rotated, the individual mirror surfaces successively deflect the correction light beam 1. This allows the rotational speed to be reduced to a value of 15,000 revolutions per minute, equivalent to a frequency of 250 Hz, for example, when the number of mirror surfaces is 24. A number of mirror surfaces in the range 24 to 32 mirrors is advantageous. The mirror material can, for example, be magnesium or ZERODUR (trademark of Schott AG).

FIG. 7 shows in a detailed view the mode of operation of the first scanning device in cooperation with the deflecting mirror 24.

Instead of a deflecting mirror 24, such as that presented in the exemplary embodiment of FIGS. 6 and 7, other optical elements, too, such as lenses, mirrors, diffractive or refractive optical elements can be provided in the correction light beam path, especially between a first scanning device and a second scanning device 25 in order that optimal irradiation of the surface 9 of the optical element 6 may be achieved.

In the example shown in FIG. 6, it is particularly advantageous that, due to the displaceable mirror 25, which forms the second scanning device 25, focus tracking is dispensable or quasi integrated, because the change in the distance of the point of incidence on the surface 9 from the scanning device is compensated by the displacement of the mirror 25. Moreover, due to the displacement of the mirror 25, the correction light beam 1, at least in the one scanning direction, always strikes the surface 9 of the optical element 6 at the same angle, such that the size of the incident light beam 1 changes not on account of different angle of incidence as a function of point of incidence. Correspondingly, an additional focus tracking can be dispensed with.

The movement of the mirror 25 can be realised, as with the other moved parts, in any suitable way by corresponding electromotive drives and the like.

Figure 8:
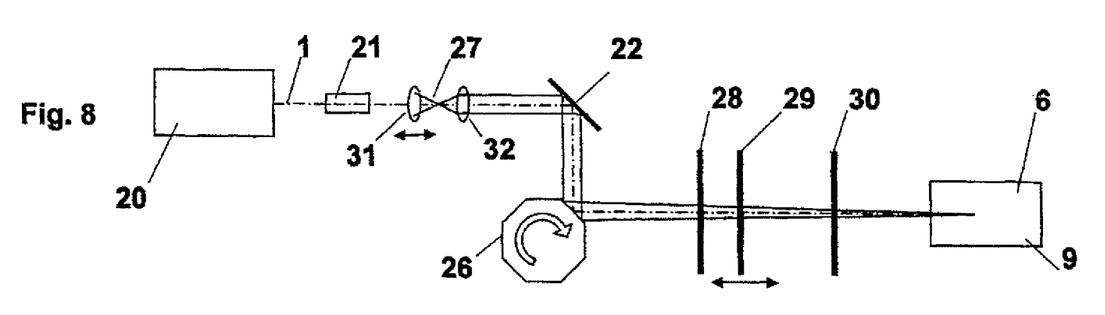
FIG. 8 shows a correction light device.
Figure 9:
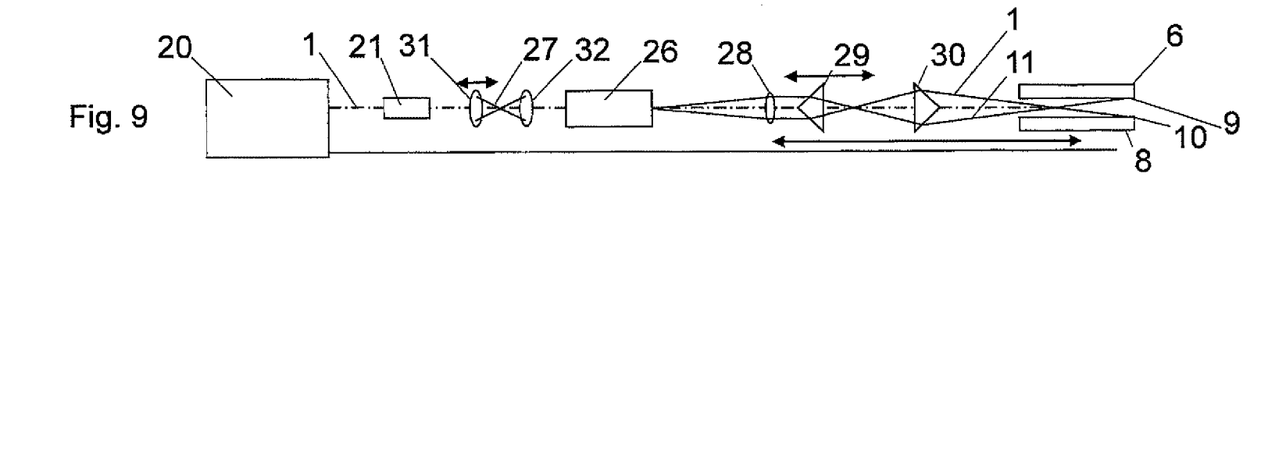
FIG. 9 is a 90°-rotated view of the correction light device from FIG. 8.

FIGS. 8 and 9 show in two diagrams rotated at 90° to each other a correction light device in which, again, components identical with those in the exemplary embodiment of FIG. 6 bear the same reference symbols. Only those components which differ relative to the exemplary embodiment of FIG. 6 will therefore be described in detail in the following.

The correction light device of FIGS. 8 and 9 differs from that of FIG. 6 especially in that, instead of one irradiated surface of an optical element 9, two surfaces 9 and 10 of two optical elements 6 and 8 can be irradiated simultaneously by a correction light source 20.

In addition, the correction light device of FIGS. 8 and 9 has a focus tracking 27, which ensures that the size of the incident correction light is the same, irrespective of the point of incidence of the correction light beam.

In the correction light device of FIGS. 8 and 9, the infrared light 1, which is generated in the $CO_2$ laser 20, is guided via the acoustic-optic modulator 21 to the focus tracking system 27, with the latter consisting of two optical lenses 31 and 32, of which one optical lens 31 is arranged so as to be displaceable along the optical axis.

Thereafter the correction light beam 1 is directed via the mirror element 22 onto a polygon scanner 26 with a plurality of polygonally arranged mirror surfaces, which scanner rotates about an axis parallel to the mirror planes, such that the correction light beam 1 can be moved in a first scanning direction along a line. The correction light beam 1 then strikes a collecting lens 28, which guides the correction light beam onto the second scanning device consisting of two Fresnel prisms or bi-prisms 29 and 30. The collecting lens is arranged at the focal length distance from the scanner 26, such that the beam bundle exiting the collecting lens 28 is parallel. Via the first Fresnel prism 29, the parallel correction light beam 1 is split into two separate light beams 1 and 11, which are directed by the second Fresnel prism 30 onto the surfaces 9 and 10 of the optical elements 6 and 8. Through displacement of the Fresnel prism 29 along the optical axis, the point of incidence of the correction light beams 1 and 11 on surfaces 9 and 10 of the optical elements 6 and 8 can be changed in a second scanning direction perpendicular to the first scanning direction. Similarly, through this arrangement, too, all regions of the surfaces 9 and 10 of the optical elements 6 and 8 can be covered with consistently large correction light beams 1 and 11. Through the chosen arrangement, it is possible here, too, to irradiate all regions of two surfaces of optical elements with correction light of constant beam size from the side at a very shallow angle.

It is furthermore possible to divide the acoustic-optic modulator 21 in FIG. 9 into upper and lower areas which can be actuated independently. As can be seen from the beam path, the portion of the correction light bundle passing through the lower area of the acoustic-optic modulator illuminates the surface 9 and the portion of the correction light bundle passing through the upper area illuminates the surface 10. Thus, different irradiation intensity is adjustable.

Through corresponding choice of a suitable focal length of the optical correction light arrangement 28, 29, 30 or the lens 28, the correction light device can be provided relatively far away from the optical axis of the optical elements 6 or 8 to be irradiated, with especially an arrangement outside the lens housing being possible.

Figure 10:
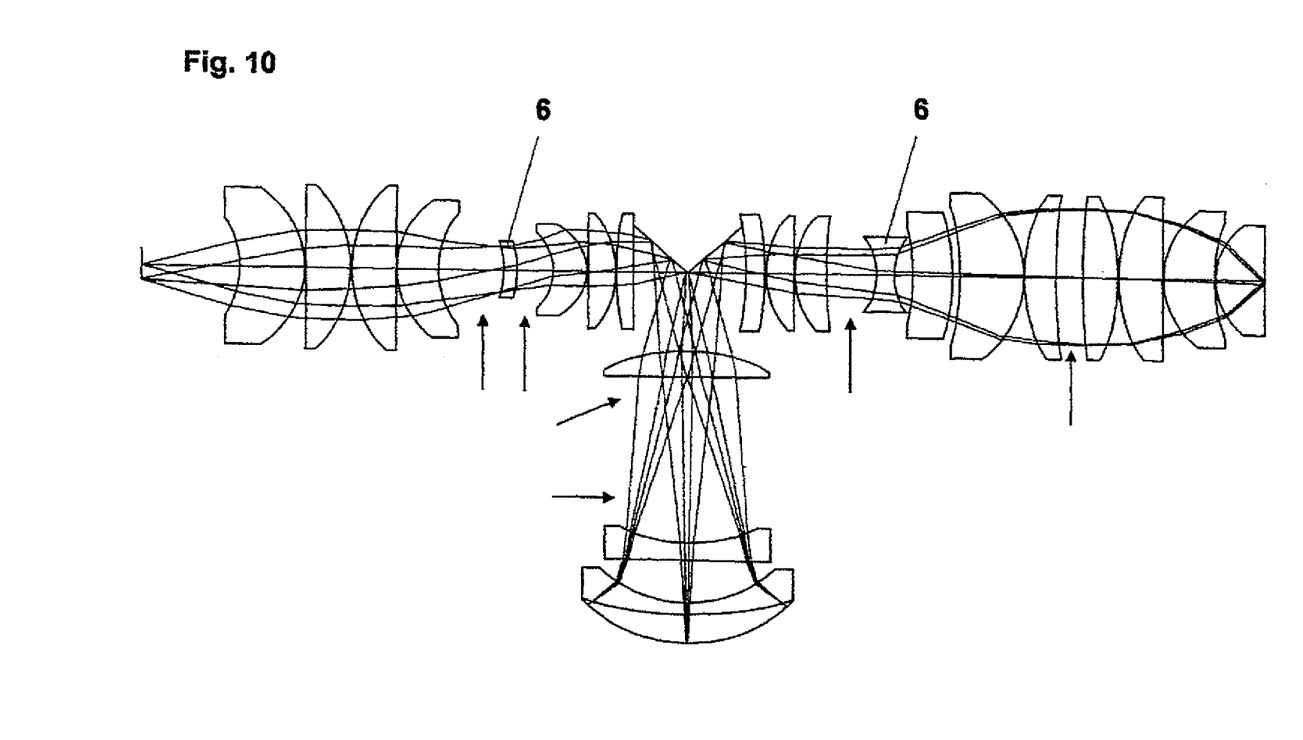
FIG. 10 is an illustration of a lens in which a correction light devices can be used.

FIG. 10 shows an optical arrangement in which a correction light devices can find application. By way of example of correction, possible optical elements 6 are labelled, with the arrows identifying additional regions of the optical arrangement in which a correction light device could be provided. Since the correction light devices, despite the very shallow irradiation angle of the correction light onto the optical elements to be irradiated or corrected, involve a certain free height for irradiating with the correction light, candidate regions of an optical arrangement are especially those in which the optical elements are provided at a certain distance from each other. The correction light devices can in this regard be provided for the most part outside the lens housing.

Figure 11:
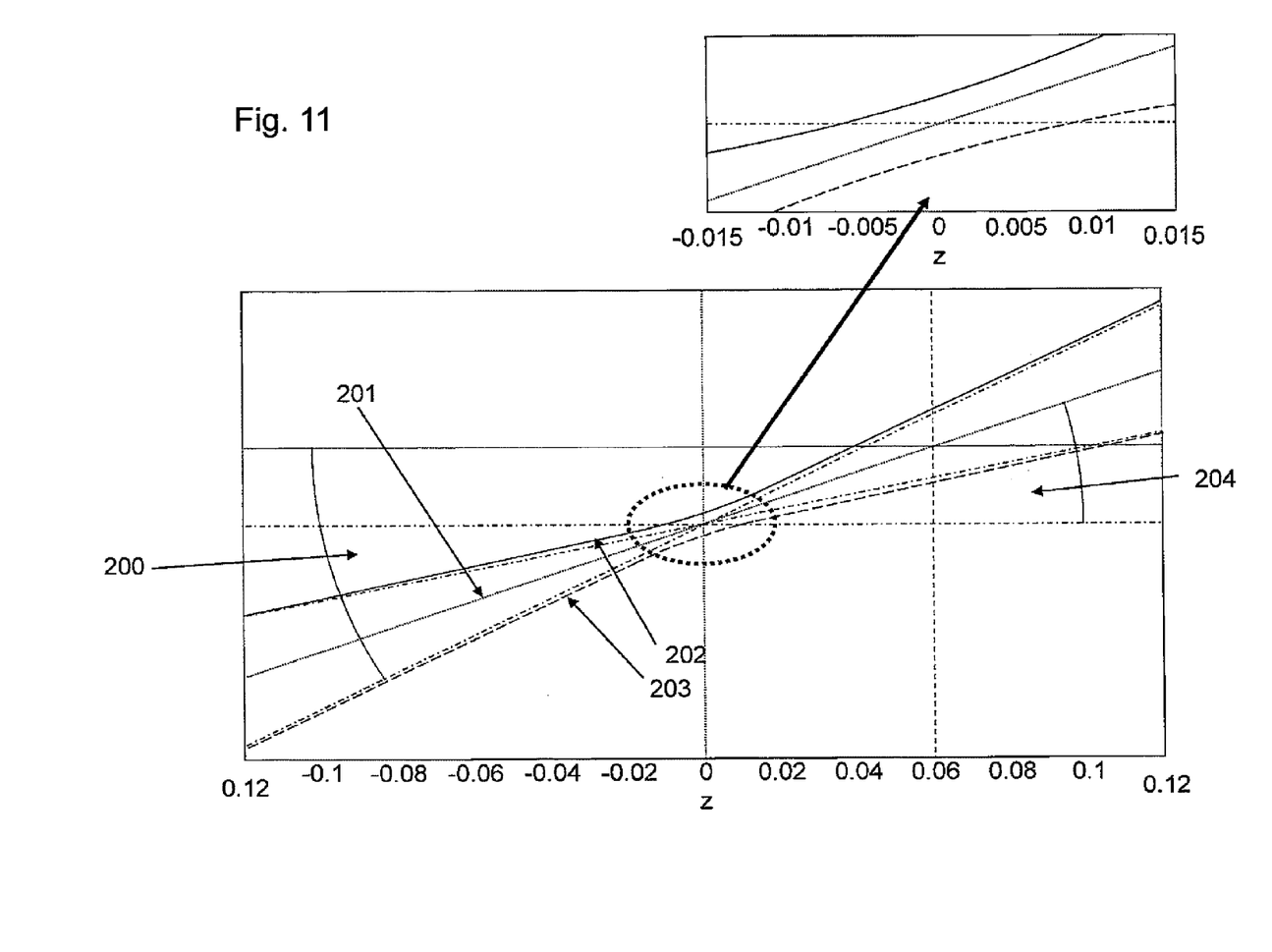
FIG. 11 is a diagram that explains the relationship between the angle of incidence of the correction light, its numerical aperture and the light spot size.

FIG. 11 shows a chart of the complex relationships between the dependence of the size of the light spot, generated on the optical element to be corrected, on the angle of incidence and the numerical aperture (NA). Due to the environment of the optical element to be corrected, there is a maximum angle of incidence, which is determined especially by the distance between the optical element to be corrected and neighbouring elements, and its lateral extension, i.e. the area dimension of the surface to be corrected. This means, however, that the optimum angle of incidence for the medial beam of a light bundle and the numerical aperture of the beam in the plane of incidence of the light beam is largely predetermined. However, the numerical aperture transverse to that can be optimized, such that the use of an anamorphic light bundle can be advantageous. The optimization of the numerical aperture transverse to the plane of incidence can take place with a view to improving efficiency of illumination or mixing of the illumination. For example, when a multi-mirror array is used, the numerical aperture can be increased, such that a smaller dot image is produced. This can be advantageous, however, because an area is imaged by the multi-mirror array. In the exemplary embodiment of the correction light device with a scanning device, changing the numerical aperture enables the dimensions of the light spot to be adjusted, for example, to the mirror elements to be moved, such that, in particular, the dimensions of mirror elements to be moved quickly can be kept small.

The diagram shows a correction light bundle with the maximum angle of incidence 200, the medial (central) beam 201 and the medial (central) angle of incidence 204 and the dependence of the light spot cross-sections in the focus area on the angle of incidence and the numerical aperture NA. Apart from the medial (central) beam 201, the beam is described by the so-called Gaussian-edge beam (Gauss-Rand-Strahl) 202 (solid line=$1/e^3$ intensity level) and the geometric edge beam 203 (dashed lines). From the $1/e^3$ beam waist w0 as a function of distance z from the beam waist, the $1/e^3$ beam width computes to $$w(z, w0) := 1,5 \sqrt{(w0)^2 \left(1 + \left(\frac{\lambda \cdot z}{\pi \cdot w0^2}\right)^2\right)}$$

where $$NA(w0) := \frac{1,83}{2(2w0)}$$

As is apparent from the diagram, the light spot grows larger with increasingly flat angle of incidence and distance from the focus area. With increase in NA, the beam waist becomes smaller, to be sure, but the beam cross-section increases faster with increase in distance from the focus.

For example, at a maximum angle of incidence of 10° and a wavelength of 10.9 μm, the optimal angle of incidence of the medial beam is 9° and the optimum numerical aperture is 0.017, yielding a minimum light spot size of approximately 5.5 mm.

Although the disclosure using the attached drawings has been described in detail in relation to exemplary embodiments, it will be clear to a person skilled in the art that modifications and changes are possible such that different individual characteristics may be combined or individual characteristics omitted, without surrender of the scope of protection of the enclosed characteristics.

What is claimed is:

1. A device for heating a surface of at least one optical element of a projection objective of a projection exposure system for microlithography, the projection objective comprising a plurality of optical elements arranged along an optical axis, the optical elements being configured to direct exposure light from a mask in an object plane of the projection objective to a substrate in an image field of the projection objective during operation of the projection exposure system for microlithography, the device comprising:
a correction light source different from a source of the exposure light; and
an optical arrangement configured so that when arranged in the projection objective, the device directs correction light from the correction light source to the optical element via the optical arrangement such that at least part of a surface of the optical element of the projection objective is irradiated with the correction light,
wherein the correction light strikes the part of the surface of the optical element of the projection objective at an angle such that an obtuse angle between the optical axis of the projection objective at the location of the optical element and the correction light is less than or equal to 105°.

2. The device of claim 1, wherein the optical arrangement is arranged to direct the correction light to irradiate the surface of the optical element in a locally variable fashion to reduce unevenness in heating of the optical element by the exposure light when the optical arrangement is arranged in the projection objective.

3. The device of claim 2, wherein the unevenness in heating of the surface by the exposure light is caused by non-uniform irradiation of the optical element by the exposure light.

4. The device of claim 1, wherein the optical arrangement comprises a mirror arrangement configured to direct the correction light from the correction light source to the optical element of the projection objective when the optical arrangement is arranged in the projection objective.

5. The device of claim 4, wherein the mirror arrangement is configured to direct the correction light from the correction light source to the optical element of the projection objective so that the optical element is irradiated with the correction light in a locally variable fashion and/or temporally variable fashion when the optical arrangement is arranged in the projection objective.

6. The device of claim 4, wherein the mirror arrangement comprises a plurality of mirror elements each arranged to direct light to a different region of the surface of the optical element when the optical arrangement is arranged in the projection objective.

7. The device of claim 6, wherein each of the mirror elements is switchable between a first state in which the mirror directs correction light toward the surface and a second state in which the mirror does not direct light to the surface when the optical arrangement is arranged in the projection objective.

8. The device of claim 7, wherein the plurality of mirror elements are switchable between the first and second states separate from each other.

9. The device of claim 6, wherein the device comprises one or more additional elements positioned to direct the correction light from the mirror arrangement to the surface of the optical element.

10. The device of claim 5, wherein the mirror elements are arranged side by side.

11. The device of claim 5, wherein the mirror arrangement comprises a multi-mirror array (MMA).

12. The device of claim 5, wherein the mirror arrangement comprises a polygonal mirror array.

13. The device of claim 5, further comprising a grating, and wherein the grating is between the correction light source and the mirror arrangement, and/or the grating is between the mirror arrangement and the optical element of the projection objective.

14. The device of claim 1, wherein the correction light source is a laser.

15. The device of claim 14, wherein the laser is a $CO_2$ laser.

16. The device of claim 1, wherein the correction light has a wavelength greater than or equal to 4 µm.

17. A projection exposure system for microlithography, comprising a projection objective and the device of claim 1 arranged to direct correction light from the correction light source to an optical element of the projection objective.

18. The projection exposure system of claim 17, wherein the correction light reduces thermal inhomogeneities of the optical element caused by exposure light.

19. The projection exposure system of claim 17, wherein the correction light beam is configured to heat the optical element for a period of time in which the optical element is unevenly heated by exposure light.

20. The projection exposure system of claim 17, wherein the projection objective comprises a curved mirror.

21. The projection exposure system of claim 20, wherein the projection objective comprises a plane mirror.

* * * * *